US008386884B2

(12) United States Patent
Chen

(10) Patent No.: US 8,386,884 B2
(45) Date of Patent: Feb. 26, 2013

(54) MEMORY APPARATUS WITH MULTI-LEVEL CELLS AND OPERATION METHOD THEREOF

(75) Inventor: Chung-Kuang Chen, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 896 days.

(21) Appl. No.: 12/502,353

(22) Filed: Jul. 14, 2009

(65) Prior Publication Data

US 2011/0016370 A1 Jan. 20, 2011

(51) Int. Cl.
*G11C 29/00* (2006.01)
*G11C 11/34* (2006.01)

(52) U.S. Cl. ............... 714/763; 714/773; 365/185.03; 365/185.09; 365/185.11; 365/185.2; 365/185.21

(58) Field of Classification Search .............. 714/773
See application file for complete search history.

(56) References Cited

U.S. PATENT DOCUMENTS

| | | | |
|---|---|---|---|
| 2007/0109854 A1 | 5/2007 | Shibata | |
| 2007/0297227 A1* | 12/2007 | Wu | 365/185.03 |
| 2008/0002464 A1 | 1/2008 | Maayan | |
| 2008/0002468 A1 | 1/2008 | Hemink | |
| 2008/0025102 A1* | 1/2008 | Chen et al. | 365/185.24 |
| 2008/0158950 A1 | 7/2008 | Aritome | |
| 2008/0158952 A1 | 7/2008 | Aritome | |
| 2009/0207659 A1* | 8/2009 | Song et al. | 365/185.03 |
| 2010/0046296 A1* | 2/2010 | Liao | 365/185.18 |
| 2011/0063906 A1* | 3/2011 | Sarin et al. | 365/185.03 |
| 2011/0280079 A1* | 11/2011 | Ghodsi et al. | 365/185.18 |

* cited by examiner

*Primary Examiner* — Albert Decady
*Assistant Examiner* — Justin R Knapp
(74) *Attorney, Agent, or Firm* — J.C. Patents

(57) ABSTRACT

A memory apparatus and an operation method thereof are provided. The memory apparatus includes a plurality of multi-level cells and a controller. The controller encodes input data according to a target encoding code to generate a plurality of encoded subsets, and stores the encoded subsets into the multi-level cells. Thereafter, the controller could read data from the multi-level cells, perform an error correction procedure on the read data to correct and recover the read data as recovered data, and decode the recovered data according to the target encoding code. Consequently, sensing windows between threshold voltage distributions of the multi-level cells are expanded.

34 Claims, 15 Drawing Sheets

| Data value \ Stored data | $D_A$ | $D_B$ | $D_C$ |
|---|---|---|---|
| 0000 | A1 | B1 | C1 |
| 0001 | A2 | B2 | C2 |
| 0010 | A3 | B3 | |
| 0011 | A4 | B4 | C3 |
| 0100 | A5 | B5 | C4 |
| 0101 | A6 | B6 | C5 |
| 0110 | A7 | B7 | C6 |
| 0111 | A8 | B8 | |
| 1000 | A9 | B9 | |
| 1001 | A10 | B10 | |
| 1010 | A11 | B11 | C7 |
| 1011 | A12 | B12 | |
| 1100 | A13 | B13 | C8 |
| 1101 | A14 | B14 | C9 |
| 1110 | A15 | B15 | |
| 1111 | A16 | B16 | C10 |

FIG. 9

|  |  |  |  | XX00 | 00XX | X0X0 | 0X0X |  |  |  |  |
|---|---|---|---|---|---|---|---|---|---|---|---|
| Data state | $D_A$ | $D_{A1}$ | $D_{A2}$ | $D_{A2(1)}$ | $D_{A2(2)}$ | $D_{A2(3)}$ | $D_{A2(4)}$ | $D_{B1}$ | $D_{B2}$ | $D_{B3}$ | $D_{B4}$ |
| 0000 | 63 | 52 | 11 | 44 | 43 | 54 | 16 | 96 | 95 | 106 | 68 |
| 0001 | 45 | 42 | 03 | 36 | 27 | 36 | 22 | 78 | 69 | 78 | 64 |
| 0010 | 49 | 22 | 27 | 63 | 03 | 55 | 12 | 85 | 25 | 77 | 34 |
| 0011 | 89 | 46 | 43 | 52 | 11 | 25 | 13 | 98 | 57 | 71 | 59 |
| 0100 | 64 | 42 | 22 | 55 | 12 | 63 | 03 | 97 | 54 | 105 | 45 |
| 0101 | 62 | 46 | 16 | 25 | 13 | 52 | 11 | 71 | 59 | 98 | 57 |
| 0110 | 65 | 52 | 13 | 54 | 16 | 44 | 43 | 106 | 68 | 96 | 95 |
| 0111 | 54 | 42 | 12 | 36 | 22 | 36 | 27 | 78 | 64 | 78 | 69 |
| 1000 | 78 | 23 | 55 | 22 | 36 | 27 | 36 | 45 | 59 | 50 | 59 |
| 1001 | 36 | 11 | 25 | 16 | 54 | 43 | 44 | 27 | 65 | 54 | 55 |
| 1010 | 78 | 24 | 54 | 13 | 25 | 11 | 52 | 37 | 49 | 35 | 76 |
| 1011 | 69 | 33 | 36 | 12 | 55 | 03 | 63 | 45 | 88 | 36 | 96 |
| 1100 | 68 | 24 | 44 | 11 | 52 | 13 | 25 | 35 | 76 | 37 | 49 |
| 1101 | 47 | 11 | 36 | 03 | 63 | 12 | 55 | 14 | 74 | 23 | 66 |
| 1110 | 92 | 29 | 63 | 27 | 36 | 22 | 36 | 56 | 65 | 51 | 65 |
| 1111 | 65 | 13 | 52 | 43 | 44 | 16 | 54 | 56 | 57 | 29 | 67 |

FIG. 13

MEMORY APPARATUS WITH MULTI-LEVEL CELLS AND OPERATION METHOD THEREOF

BACKGROUND OF THE INVENTION

1. Field of the Invention

The present invention relates to a memory apparatus and an operation method thereof. More particularly, the present invention relates to a memory apparatus of a flash memory with multi-level cells (MLCs), and an operation method thereof.

2. Description of Related Art

A flash memory is one kind of non-volatile memories, which can maintain stored data without power. The flash memories are categorized into NOR flash memories and NAND flash memories. Moreover, the flash memories can also be categorized into single level cell (SLC) flash memories and multi level cell (MLC) flash memories according to an amount of bits capable of being stored in a single memory cell. Wherein, the "single level" represents that each of the memory cells only records data of one bit, and the "multi level" represents that each of the memory cells records data of multiple bits. Since the MLC records more data bits compared to the SLC, the MLC has to distinguish values of the stored data according to more different threshold voltage distributions.

As data storage amount is increased, sensing windows between the threshold voltage distributions of the MLCs become narrower. The narrower the sensing window is, the more difficult a data state corresponding to each of the threshold voltage distributions is distinguished. FIG. 1 is a diagram illustrating threshold voltage distributions of the conventional MLCs. FIG. 2 is another diagram illustrating the threshold voltage distributions of the conventional MLCs. Referring to FIG. 1 and FIG. 2, horizontal axes of FIG. 1 and FIG. 2 represent the threshold voltages of the MLCs, and vertical axes represent numbers of the MLCs. Each of the MLCs of FIG. 1 stores 2 bits of data, so that there are four threshold voltage distributions V1-V4 are illustrated in FIG. 1, wherein the sensing window between two adjacent threshold voltage distributions is SW1. Each of the MLCs of FIG. 2 stores 4 bits of data, so that there are 16 threshold voltage distributions W1-W16 are illustrated in FIG. 2, wherein the sensing window between two adjacent threshold voltage distributions is SW2. As shown in figures, a threshold voltage difference between the threshold voltage distributions V1 and V4 is equal to a threshold voltage difference between the threshold voltage distributions W1 and W16, so that the threshold voltage distributions W1-W16 are denser than the threshold voltage distributions V1-V4, and therefore the sensing window SW2 is narrower than the sensing window SW1. Accordingly, the more bits that a single MLC stores, the narrower the sensing window between the threshold voltage distributions is. Therefore, regarding a flash memory whose a single MLC stores more bits, an occurrence chance of write operation errors or read operation errors thereof is relatively high. Therefore, how to reduce the occurrence chance of the write operation errors or the read operation errors caused by lessening of the sensing window in a MLC flash memory is a major problem to be resolved.

SUMMARY OF THE INVENTION

The present invention is directed to an operation method of a memory apparatus, by which an occurrence chance of write operation errors or read operation errors of a memory caused by excessive dense of threshold voltage distributions can be reduced.

The present invention is directed to a memory apparatus, which may use an error correction function to define skipped threshold voltage distributions, so as to expand sensing windows between threshold voltage distributions of multi-level cells (MLCs) of the memory apparatus.

The present invention provides a method for operating a memory. The memory includes a plurality of multi-level cells (MLCs). The method for operating the memory includes the following steps. First, a target encoding code is selected from a plurality of encoding codes. Next, input data is encoded according to the target encoding code to generate a plurality of encoded subsets, wherein the encoded subsets are associated with a plurality of threshold voltage distributions of the MLCs. Any of the threshold voltage distributions is defined as a skipped threshold voltage distribution or as a reserved threshold voltage distribution according to a predetermined number. The number of instances of each skipped threshold voltage distribution is less than the predetermined number, and the number of instances of each reserved threshold voltage distribution is greater than or equal to the predetermined number. Next, a sensing reference code is generated according to the skipped threshold voltage distributions and the reserved threshold voltage distributions. Then, the target encoding code, the sensing reference code, and the encoded subsets are stored to the memory.

The present invention provides a method for operating a memory, wherein the memory includes a plurality of MLCs. The method for operating the memory includes the following steps. First, input data is encoded according to a plurality of encoding codes to generate a plurality of encoded data sets, each of which is generated according to a corresponding one of the encoding codes. Next, each of the encoded data sets is divided into a plurality of encoded subsets, wherein the encoded subsets are associated with a plurality of threshold voltage distributions of the MLCs. Any of the threshold voltage distributions is defined as a skipped threshold voltage distribution or as a reserved threshold voltage distribution according to a predetermined number. The number of instances of each skipped threshold voltage distribution is less than the predetermined number, and the number of instances of each reserved threshold voltage distribution is greater than or equal to the predetermined number. Next, a target encoding code is selected from the encoding codes, wherein the target encoding code corresponds to a maximal number of the skipped threshold voltage distributions as compared with other unselected encoding codes. Then, a sensing reference code is generated according to the skipped threshold voltage distributions and the reserved threshold voltage distributions that are corresponded to the target encoding code. Finally, the target encoding code, the sensing reference code, and the encoded subsets are stored to the memory.

The present invention provides a memory apparatus having a memory and a controller. The memory has a plurality of multi-level cells for storing data. The controller is coupled to the memory and has an encoder and a calculating circuit. The encoder encodes input data according to a plurality of encoding codes to generate a plurality of encoded data sets, each of which is generated according to a corresponding one of the encoding codes. The controller divides each of the encoded data sets into a plurality of encoded subsets associated with a plurality of threshold voltage distributions of the multi-level cells, and the controller defines any of the threshold voltage distributions as a skipped threshold voltage distribution or as a reserved threshold voltage distribution according to a predetermined number. The number of instances of each skipped threshold voltage distribution is less than the predetermined number, and the number of instances of each reserved threshold voltage distribution is greater than or equal to the predetermined number. The controller selects a target encoding code from the encoding codes, the target encoding code corresponds to a maximal number of the skipped threshold voltage distributions as compared with other unselected encoding codes. The calculating circuit generates a sensing reference code according to the skipped threshold voltage distributions and the reserved threshold voltage distributions that are corresponded to the target encoding code. The controller stores the target encoding code, the sensing reference code, and the encoded subsets to the memory.

The present invention provides a memory apparatus having a memory and a controller. The memory has a plurality of multi-level cells for storing data. The controller is coupled to the memory and has an encoder and a calculating circuit. The encoder encodes input data according to a plurality of encoding codes to generate a plurality of encoded data sets, each of which is generated according to a corresponding one of the encoding codes. The controller divides each of the encoded data sets into a plurality of encoded subsets associated with a plurality of threshold voltage distributions of the multi-level cells. The controller defines any of the threshold voltage distributions as a skipped threshold voltage distribution or as a reserved threshold voltage distribution according to a predetermined number. The number of instances of each skipped threshold voltage distribution is less than the predetermined number, and the number of instances of each reserved threshold voltage distribution is greater than or equal to the predetermined number. The controller selects a target encoding code from the encoding codes. The target encoding code corresponds to a maximal number of the skipped threshold voltage distributions as compared with other unselected encoding codes. The calculating circuit generates a sensing reference code according to the skipped threshold voltage distributions and the reserved threshold voltage distributions that are corresponded to the target encoding code. The controller stores the target encoding code, the sensing reference code, and the encoded subsets to the memory.

In an embodiment of the present invention, the controller redefines any of the encoded subsets associated with the skipped threshold voltage distributions as an appointed encoded subset and redefines any of the encoded subsets associated with the reserved threshold voltage distributions as an original encoded subset. The controller converts data values of the appointed encoded subsets into one or more of data values of the reserved threshold voltage distributions before storing the appointed encoded subsets to the memory.

In an embodiment of the present invention, the target encoding code is selected according to the input data.

In an embodiment of the present invention, each of the encoding codes is the index of one scramble method.

In an embodiment of the present invention, the controller generates an error correction code according to the encoded subsets, and the controller stores the error correction code to the memory.

In an embodiment of the present invention, the memory apparatus further comprises a decoder, a sensing reference system, and an error correction circuit. The sensing reference system has a plurality of sensing reference sets, and each of the sensing reference sets has reference levels for distinguishing data read from the memory. The controller reads the target encoding code and the sensing reference code from the memory and selects one of the sensing reference sets according to the sensing reference code. The controller reads the encoded subsets and the error correction code from the memory according to the reference levels of the selected sensing reference set, and the correction circuit performs an error correction procedure on the read encoded subsets according to the error correction code to correct and recover the read encoded subsets as recovered data. The decoder decodes the recovered data into decoded data according to the read target encoding code.

In an embodiment of the present invention, the predetermined number is set according to an upper limit value of the error correction procedure.

In an embodiment of the present invention, the memory has a first block, a second block, and a third block. The first block has the multi-level cells for storing all of the encoded subsets. The target encoding code is stored in the second block, and the sensing reference code is stored in the third block.

In an embodiment of the present invention, each of the instances of the threshold voltage distribution corresponds to an encoded subset.

In the present invention, the input data is encoded to increase the skipped threshold voltage distributions of the memory, so as to increase the sensing window.

In order to make the aforementioned and other features and advantages of the present invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 9 is a table listing data values corresponding to threshold voltage distributions of and an input data, an encoded data set and a stored data set.

FIG. 13 is a table explaining a method for a controller selecting a target encoding code according to an embodiment of the present invention.

DESCRIPTION OF THE EMBODIMENTS

Figure 1:
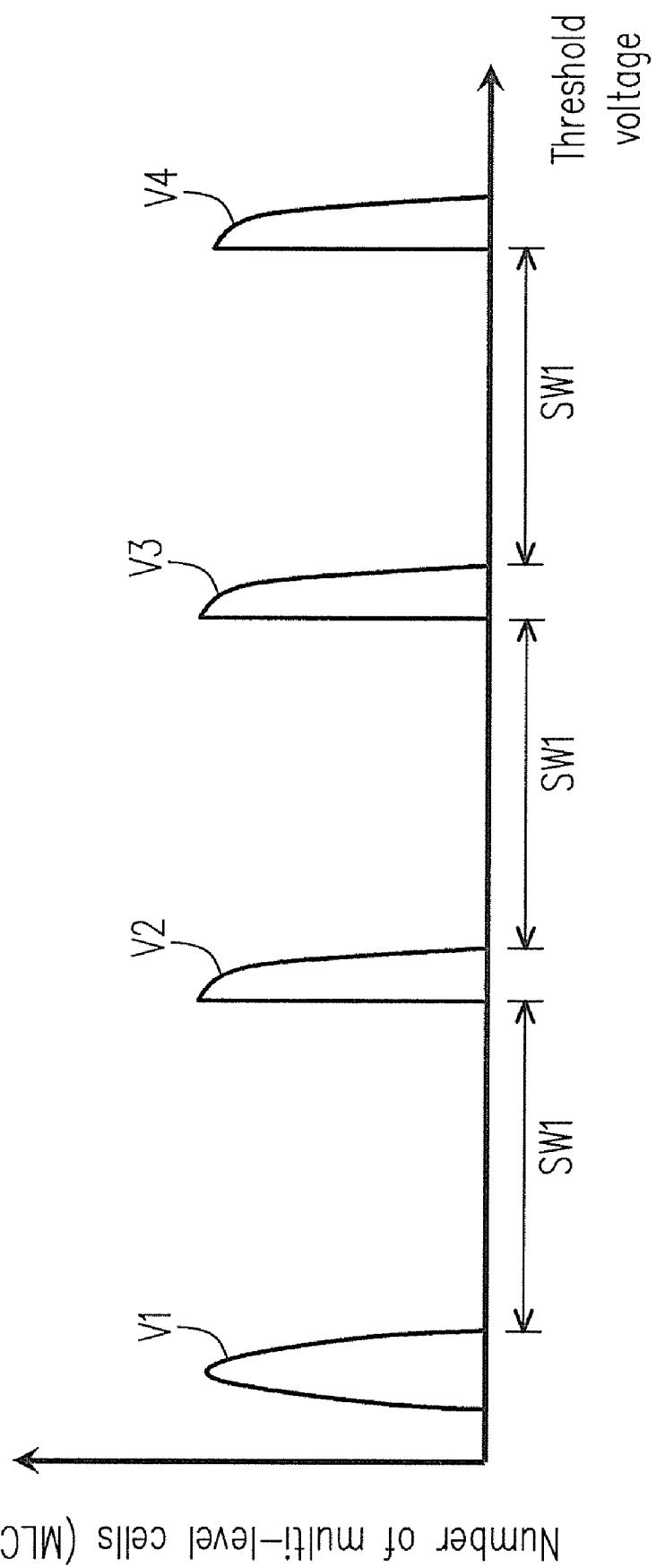
FIG. 1 is a diagram illustrating threshold voltage distributions of conventional MLCs.
Figure 2:
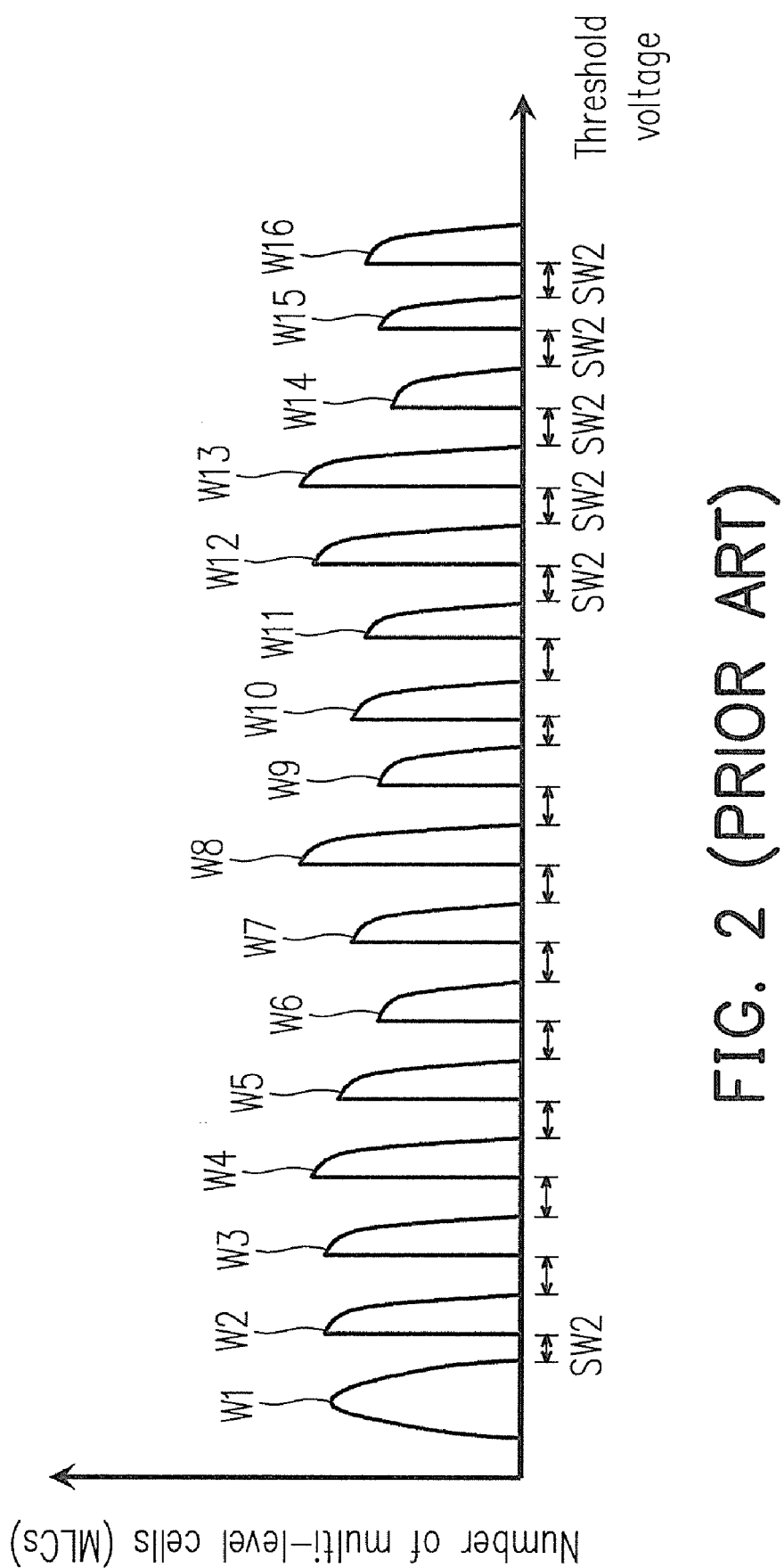
FIG. 2 is another diagram illustrating threshold voltage distributions of conventional MLCs.
Figure 3A:
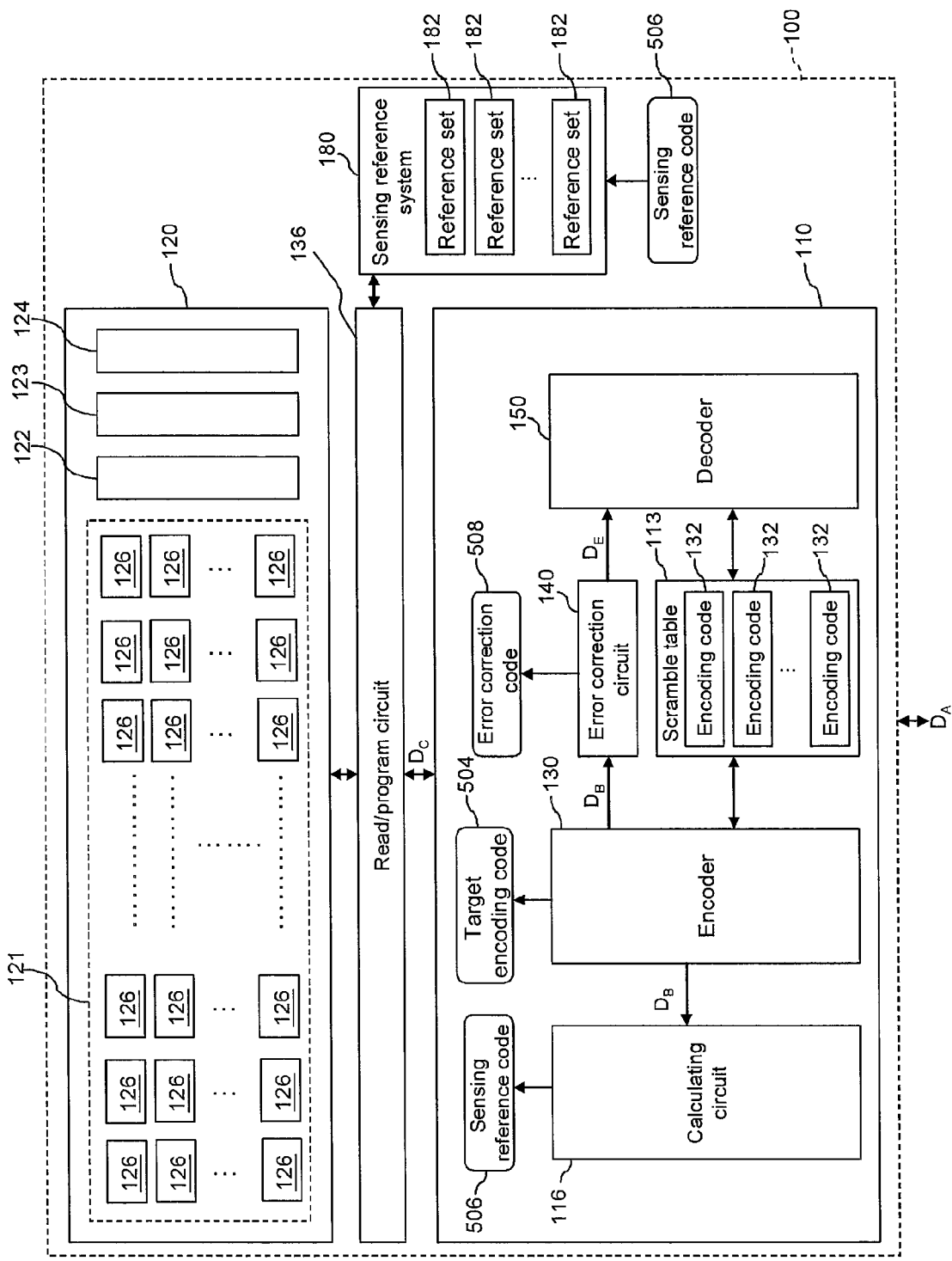
FIG. 3A is a block diagram illustrating a memory apparatus according to an embodiment of the present invention.
Figure 3B:
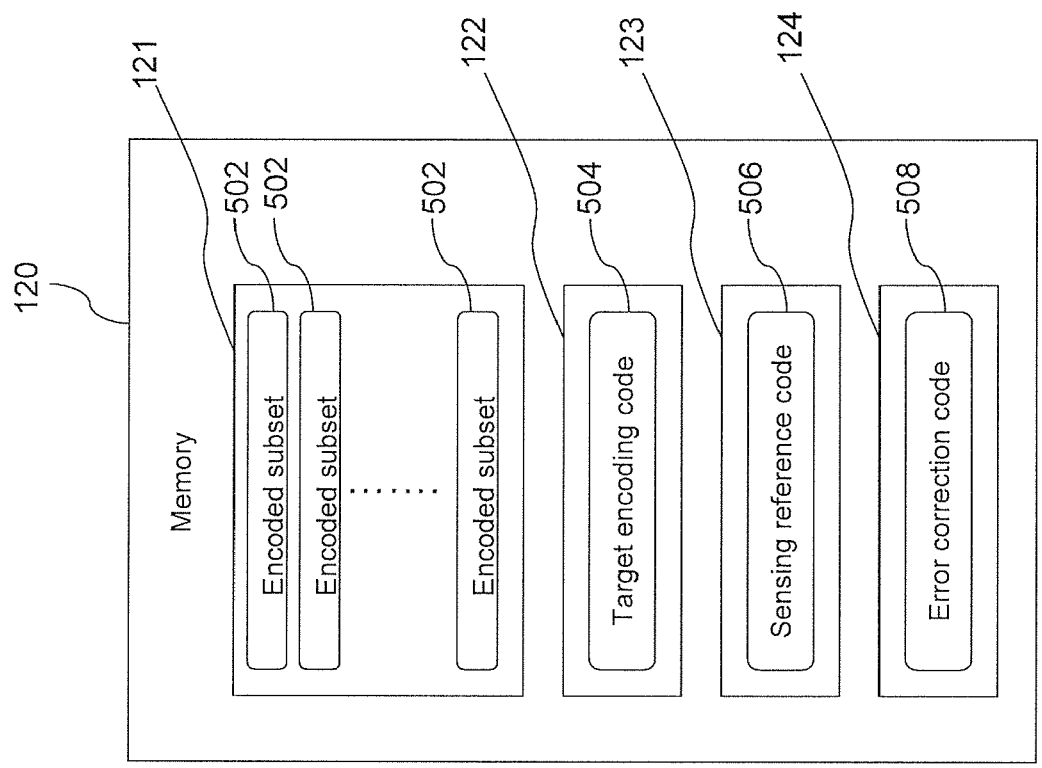
FIG. 3B is a block diagram of the memory 120 of the memory apparatus shown in FIG. 3A.

Referring to FIGS. 3A and 3B, FIG. 3A is a block diagram illustrating a memory apparatus 100 according to an embodiment of the present invention, and FIG. 3B is a block diagram of a memory 120 of the memory apparatus 100. The memory apparatus 100 includes a controller 110, the memory 120, a read/program circuit 136, and a sensing reference system 180. In the present embodiment, the memory 120 has a first block 121, a second block 122, a third block 123, and a fourth block 124. The first block 121 has a plurality of multi-level cells (MLCs) 126. Each of the MLCs 126 is used for storing two or more bits of data. For example, in the following embodiment, each of the MLCs 126 stores four bits of data, though the present invention is not limited thereto. Each of the MLCs 126 stores an encoded subset 502. Moreover, the second block 122 stores a target encoding code 504, the third block 123 stores a sensing reference code 506, and the fourth block 124 stores an error correction code (ECC) 508. The read/program circuit 136 is used to read data from the memory 120 and to program (i.e. write) the memory 120. The sensing reference system 180 supplies reference levels to the read/program circuit 136 according to the sensing reference code 506, such that the read/program circuit 136 senses readout signals received from the memory 120 according to the reference levels.

The controller 110 is coupled to the memory 120, and is used for writing, reading, and erasing data of the memory 120. The controller 110 has a calculating circuit 116, an encoder 130, an error correction circuit 140, and a decoder 150. The controller 110 receives input data $D_A$. The encoder 130 of the controller 110 encodes the input data $D_A$ according to the target encoding code 504 so as to generate an encoded data set $D_B$. The error correction circuit 140 of the controller 110 processes the encoded data set $D_B$ to generate the error correction code 508. The calculating circuit 116 of the controller 110 process the encoded data set $D_B$ to generate the sensing reference code 506. A stored data set $D_C$, which includes the encoded subsets 502, the error correction code 508, the target encoding code 504, and the sensing reference code 506, is written into the blocks 121-124 of the memory 120. In detail, the encoded subsets 502 are written into the MLCs 126 of the first block 121, the target encoding code 504 is written into the second block 122, the sensing reference code 506 is written into the third block 123, and the error correction code 508 is written into the fourth block 124.

In an embodiment of the present invention, before the encoder 130 encodes the input data $D_A$, the encoder 130 selects one of the encoding codes 132 of the scramble table 113 to serve as the target encoding code 504. Thereafter, the encoder 130 encodes the input data $D_A$ according to the scrambling method corresponding to the target encoding code 504, so as to generate the encoded subsets 502.

In the above embodiment, the encoder 130 first selects the target encoding code 504, and then encodes the input data $D_A$. In another embodiment of the present invention, the encoder 130 sequentially encodes the input data $D_A$ according to the encoding codes 132 to generate a plurality of the encoded data sets $D_B$. Wherein, each of the encoded data sets $D_B$ is generated according to a corresponding one of the encoding codes 132. The encoded data sets $D_B$ are input to the calculating circuit 116, such that the calculating circuit 116 calculates the numbers of instances of each of threshold voltage distributions of each encoded data set $D_B$. Thereafter, the controller 110 selectively outputs one of the encoded data sets $D_B$. In this embodiment, the encoding code 132 corresponding to the encoded data sets $D_B$ output by the controller 110 is the target encoding code 504.

Figure 4:
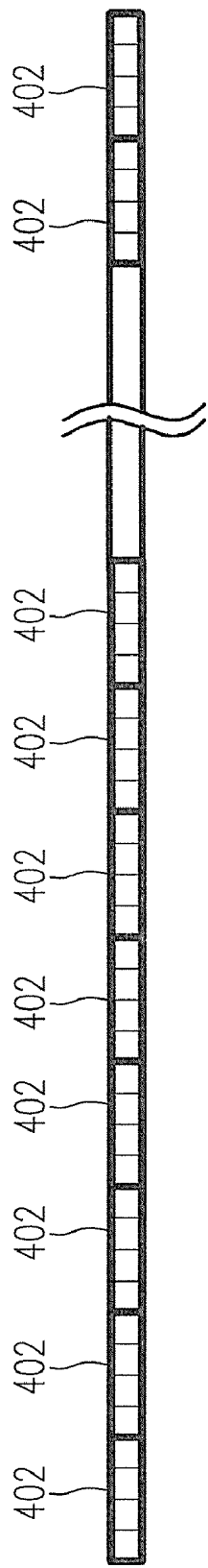
FIG. 4 is a schematic diagram of an encoded data set according to an embodiment of the present invention.
Figure 5:
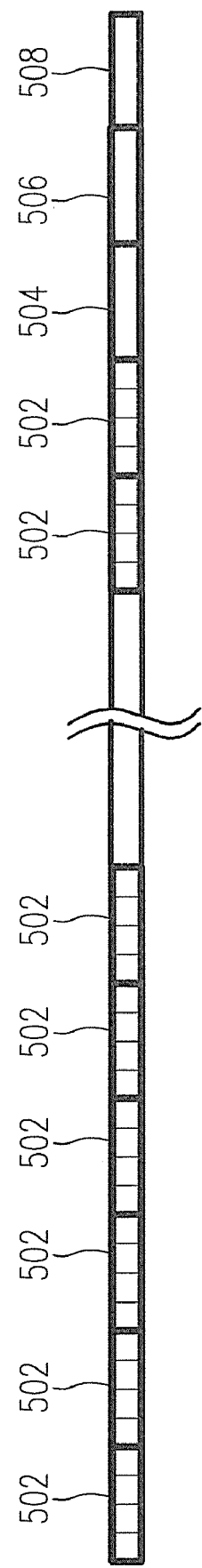
FIG. 5 is a schematic diagram of a stored data set according to an embodiment of the present invention.

Referring to FIG. 4 and FIG. 5, FIG. 4 is a schematic diagram of the encoded data set $D_B$ according to an embodiment of the present invention, and FIG. 5 is a schematic diagram of the stored data set $D_C$ according to an embodiment of the present invention. The controller 110 divides the encoded data set $D_B$ into a plurality of encoded subsets 402 according to a length of data that can be stored by one of the MLCs 126. For example, if each MLC 126 stores four bits of data, the controller 110 then divides the encoded data set $D_B$ into the encoded subsets 402 by each four bits. In such case, the length of data of each encoded subset 402 is four bits, and each encoded subset 402 contains four bits of data. Similarly, the stored data set $D_C$ has a plurality of the encoded subsets 502. Each of the encoded subsets 502 is corresponding to one of the encoded subsets 402. The length of data of each encoded subset 502 of the stored data set $D_C$ is also four bits, and each encoded subset 502 contains four bits of data. In the embodiment, the controller 110 redefines which ones of the encoded subsets 402 of the encoded data set $D_B$ are appointed encoded subsets and redefines which ones of the encoded subsets 402 are original encoded subsets. How to redefine the appointed encoded subsets and the original encoded subsets is described below.

Referring to FIG. 3A and FIG. 5 again, each of the encoded subsets 502 is recorded in one of the MLCs 126. The stored data set $D_C$ not only includes the encoded subsets 502, but also includes the target encoding code 504, the sensing reference code 506, and the error correction code 508. As described above, the target encoding code 504 is selected from the encoding codes 132 of the scramble table 113, and the encoder 130 encodes the input data $D_A$ according to the scrambling method corresponding to the target encoding code 504, so as to generate the encoded data set $D_B$. The error correction code 508 is generated by the error correction circuit 140, and is used for error-correcting the data read from the MLCs 126 of the first block 121 of the memory 120. The sensing reference code 506 is generated by the calculating circuit 116, and is used for selecting one of the reference sets 182 of the sensing reference system 180. Each of the sensing reference sets 182 has reference levels for distinguishing data read from the MLCs 126 of the memory 120.

Figure 6:
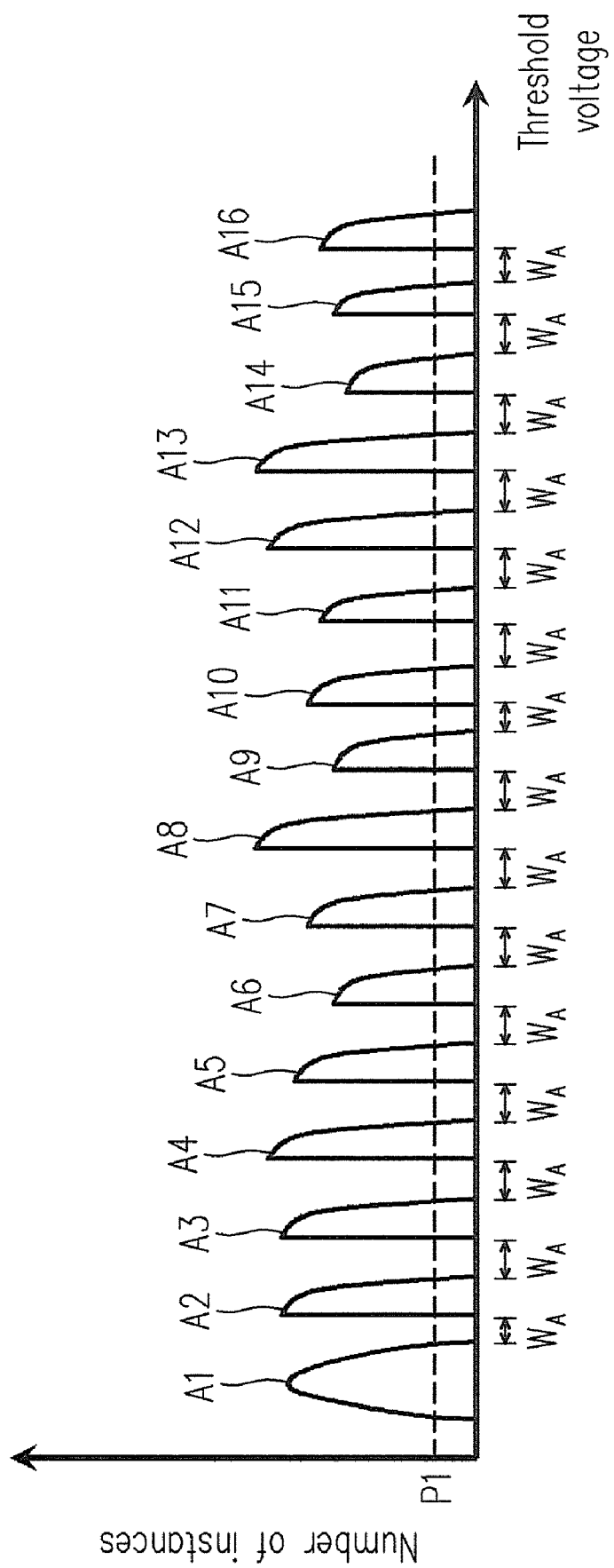
FIGS. 6-8 are diagrams illustrating threshold voltage distributions corresponding to different data.
Figure 7:
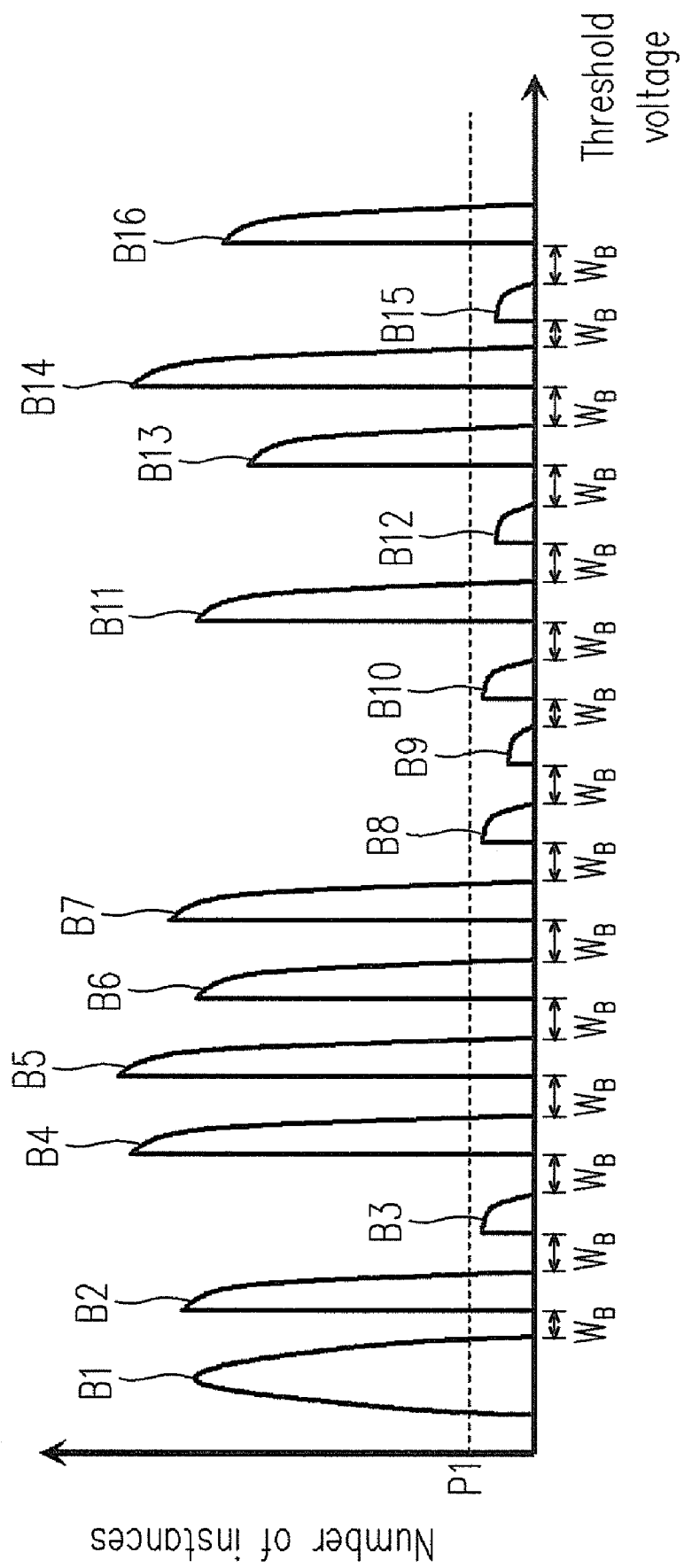
Figure 8:
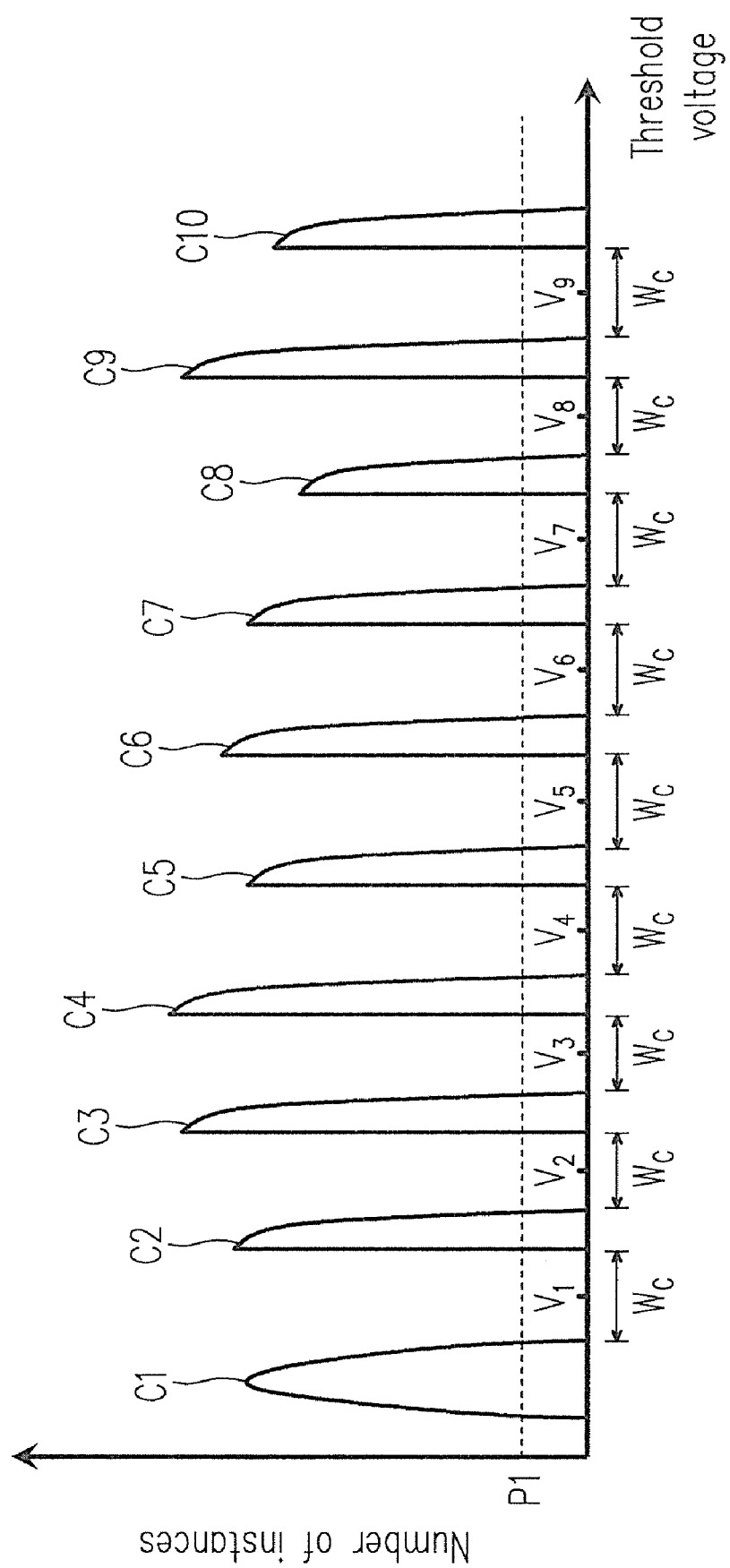

Referring to FIGS. 6-8, FIG. 6 is a diagram illustrating threshold voltage distributions of the MLCs 126 if the controller 110 directly stores the input data $D_A$ into the memory 120. FIG. 7 is a diagram illustrating threshold voltage distributions of the MLCs 126 after the input data $D_A$ is scrambled. FIG. 8 is a diagram illustrating threshold voltage distributions of the MLCs 126 when the stored data set $D_C$ is written into the memory 120. The horizontal axes of FIGS. 6-8 respectively represent the threshold voltages of the MLCs 126, and the vertical axes thereof respectively represent numbers of instances of each threshold voltage distribution. Wherein, each of the instances of the threshold voltage distributions corresponds to one of the MLCs 126, and a threshold voltage of the corresponding MLC 126 falls within the range of its threshold voltage distribution.

In the present embodiment, since each of the MLCs 126 stores four bits of data, the input data $D_A$ corresponds to 16 (i.e. $2^4$) threshold voltage distributions A1-A16 (as shown in FIG. 6). Wherein, each of the threshold voltage distributions A1-A16 corresponds to a data value. Referring to FIG. 6 and FIG. 9, FIG. 9 is a table listing the data values corresponding to the threshold voltage distributions of the input data $D_A$, the encoded data set $D_B$, and the stored data set $D_C$. Wherein, each data value is represented by four bits, and the data values corresponding to the threshold voltage distributions A1-A16 are respectively "0000", "0001", "0010", "0011", "0100", "0101", "0110", "0111", "1000", "1001", "1010", "1011", "1100", "1101", "1110" and "1111". Similarly, the encoded data set $D_B$ generated by the encoder 130 also corresponds to 16 threshold voltage distributions B1-B16. Wherein, the data values corresponding to the threshold voltage distributions B1-B16 are respectively "0000", "0001", "0010", "0011", "0100", "0101", "0110", "0111", "1000", "1001", "1010", "1011", "1100", "1101", "1110" and "1111". Each of the instances of the threshold voltage distributions B1-B16 corresponds to one encoded subset 402 of the encoded data set $D_B$. Different to the input data $D_A$ and the encoded data set $D_B$, a number of the threshold voltage distributions corresponding to the stored data set $D_C$ is less than 16. For example, in the present embodiment, the stored data set $D_C$ only corresponds to 10 threshold voltage distributions C1-C10. Wherein, the data values corresponding to the threshold voltage distributions C1-C10 are respectively "0000", "0001", "0011", "0100", "0101", "0110", "1010", "1100", "1101", and "1111". Moreover, each of the instances of the threshold voltage distributions C1-C10 corresponds to one encoded subset 502 of the encoded data set $D_C$.

Referring to FIG. 3A and FIGS. 8-9, the controller 110 determines the value of data stored in the MLCs 126 according to the threshold voltages of the MLCs 126. For example, if the threshold voltage of a MLC 126 is within a range of the threshold voltage distribution C4, the controller 110 determines the data stored in such MLC 126 to be "0100". For another example, if the threshold voltage of a MLC 126 is within a range of the threshold voltage distribution C9, the controller 110 determines the data stored in such MLC 126 to be "1101".

Referring to FIG. 7, a predetermined number P1 is used to classify the threshold voltage distributions B1-B16. In detail, the controller 110 defines any of the threshold voltage distributions B1-B16 as a skipped threshold voltage distribution or as a reserved threshold voltage distribution according to the predetermined number P1. The number of instances of each skipped threshold voltage distribution is less than the predetermined number P1, and the number of instances of each reserved threshold voltage distribution is greater than or equal to the predetermined number P1. For example, the threshold voltage distributions B3, B8, B9, B10, B12 and B15 are defined as the skipped threshold voltage distributions since their numbers of instances are less than the predetermined number P1. Moreover, the threshold voltage distributions B1, B2, B4-B7, B11, B13, B14 and B16 are defined as reserved distributions since their numbers of instances are greater than or equal to the predetermined number P1. The controller 110 redefines any of the encoded subsets 402 associated with the skipped threshold voltage distributions B3, B8, B9, B10, B12 and B15 as an appointed encoded subset. In addition, the controller 110 redefines any of the encoded subsets 402 associated with the reserved threshold voltage distributions B1, B2, B4-B7, B11, B13, B14 and B16 as an original encoded subset. In the embodiment, before storing the appointed encoded subsets to the MLCs 126, the controller 110 converts the data values of all appointed encoded subsets, which are associated with the skipped threshold voltage distributions B3, B8, B9, B10, B12 and B15, into one or more of the data values of the reserved threshold voltage distributions B1, B2, B4-B7, B11, B13, B14 and B16. For example, in an embodiment of the present invention, the data values of all appointed encoded subsets associated with the skipped threshold voltage distributions B3, B8, B9, B10, B12 and B15 could be converted into the data value "0000" of the reserved threshold voltage distribution B1. Consequently, the number of the threshold voltage distributions C1-C10 corresponding to the stored data set $D_C$ is less the number of the threshold voltage distributions B1-B16 corresponding to the encoded data set $D_B$.

The controller 110 sets the predetermined number P1 according to an upper limit value of an error correction procedure performed by the error correction circuit 140. In detail, the upper limit value of the error correction procedure is greater than or equal to the sum of the numbers of the instances of the skipped threshold voltage distributions B3, B8, B9, B10, B12 and B15. Therefore, when the error correction circuit 140 performs the error correction procedure on the data read from the MLCs 126, all errors of the read data could be corrected, and the original data could be recovered.

It should be noticed that the data values corresponding to the threshold voltage distributions of FIGS. 6-8 are only used as an example. Under the premise that the threshold voltage distributions can be used for distinguishing the data stored in the MLCs 126, the data values corresponding to the threshold voltage distributions can be adjusted. For example, in another embodiment of the present invention, the data values corresponding to the threshold voltage distributions A1-A16 are respectively "1000", "1001", "1010", "1011", "1100", "1101", "1110", "1111", "0000", "0001", "0010", "0011", "0100", "0101", "0110", and "0111".

Figure 10:
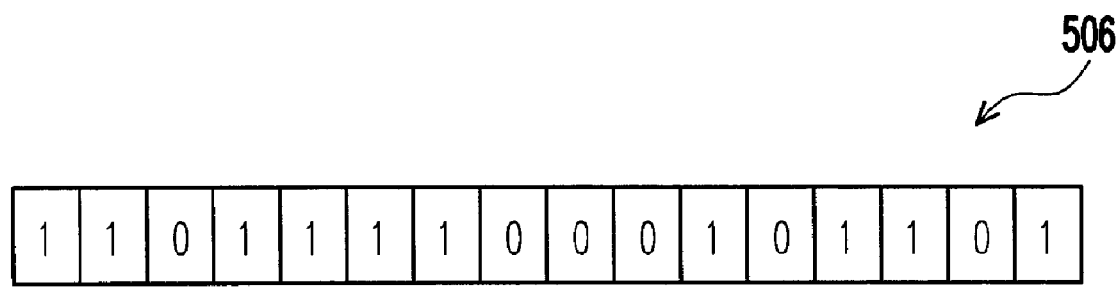
FIG. 10 is a sensing reference code based on the threshold voltage distributions shown in FIG. 8.

Referring to FIGS. 3A-3B and FIG. 5 again, as described above, the controller 110 generates the stored data set $D_C$. The stored data set $D_C$ includes the encoded subsets 502, the target encoding code 504, the sensing reference code 506, and the error correction code 508, which are respectively written into the blocks 121-124 of the memory 120. Thereafter, before the controller 110 reads the encoded subsets 502 from the first block 121 of the memory 120, the controller 110 reads the target encoding code 504 and the sensing reference code 506 from the second block 122 and the third block 123. According to the sensing reference code 506 read from the second block 122, the controller 110 selects the corresponding one of the reference sets 182 from the sensing reference system 180. As shown in FIG. 8, the selected reference set 182 has a plurality of reference levels V1-V9 for distinguishing data read from the memory 120. The read/program circuit 136 distinguishes the read data according to the reference levels V1-V9. In addition, the controller 110 also uses the sensing reference code 506 to find out which ones of the threshold voltage distributions are the skipped threshold voltage distributions. Referring to FIG. 10, FIG. 10 is an example of the sensing reference code based on the threshold voltage distributions shown in FIG. 8. The $3^{th}$, $8^{th}$, $9^{th}$, $10^{th}$, $12^{th}$, and $15^{th}$ bits of the sensing reference code is "0" to represent the skipped threshold voltage distributions B3, B8, B9, B10, B12 and B15. Moreover, the $1^{st}$, $2^{nd}$, $4^{th}$ to $7^{th}$, $11^{th}$, $13^{th}$, $14^{th}$, and $16^{th}$ bits of the sensing reference code is "1" to represent the reserved voltage distributions B1, B2, B4-B7, B11, B13, B14 and B16.

When the controller 110 reads data from the memory 120, the error correction code 508 stored in the fourth block 124 and the encoded subsets 502 stored in the MLCs 126 of the first block 121 are simultaneously read, and the error correction circuit 140 performs an error correction procedure on the read encoded subsets 502 according to the read error correction code 508, so as to correct and recover the read encoded subsets 502 to generate recovered data.

Referring to FIGS. 6-8, compared to the input data $D_A$ and the encoded data set $D_B$ that respectively correspond to 16 threshold voltage distributions, the stored data set $D_C$ corresponds to 10 threshold voltage distributions. Therefore, a sensing window $W_C$ corresponding to the stored data set $D_C$ is greater than sensing windows $W_A$ and $W_B$ corresponding to the input data $D_A$ and the encoded data set $D_B$. Since the sensing window $W_C$ is greater than the sensing windows $W_A$ and $W_B$, when the controller 110 reads data from the memory 120, the controller 110 can accurately determine the value of the data stored in the MLC 126, so that read operation errors can be reduced.

Figure 11:
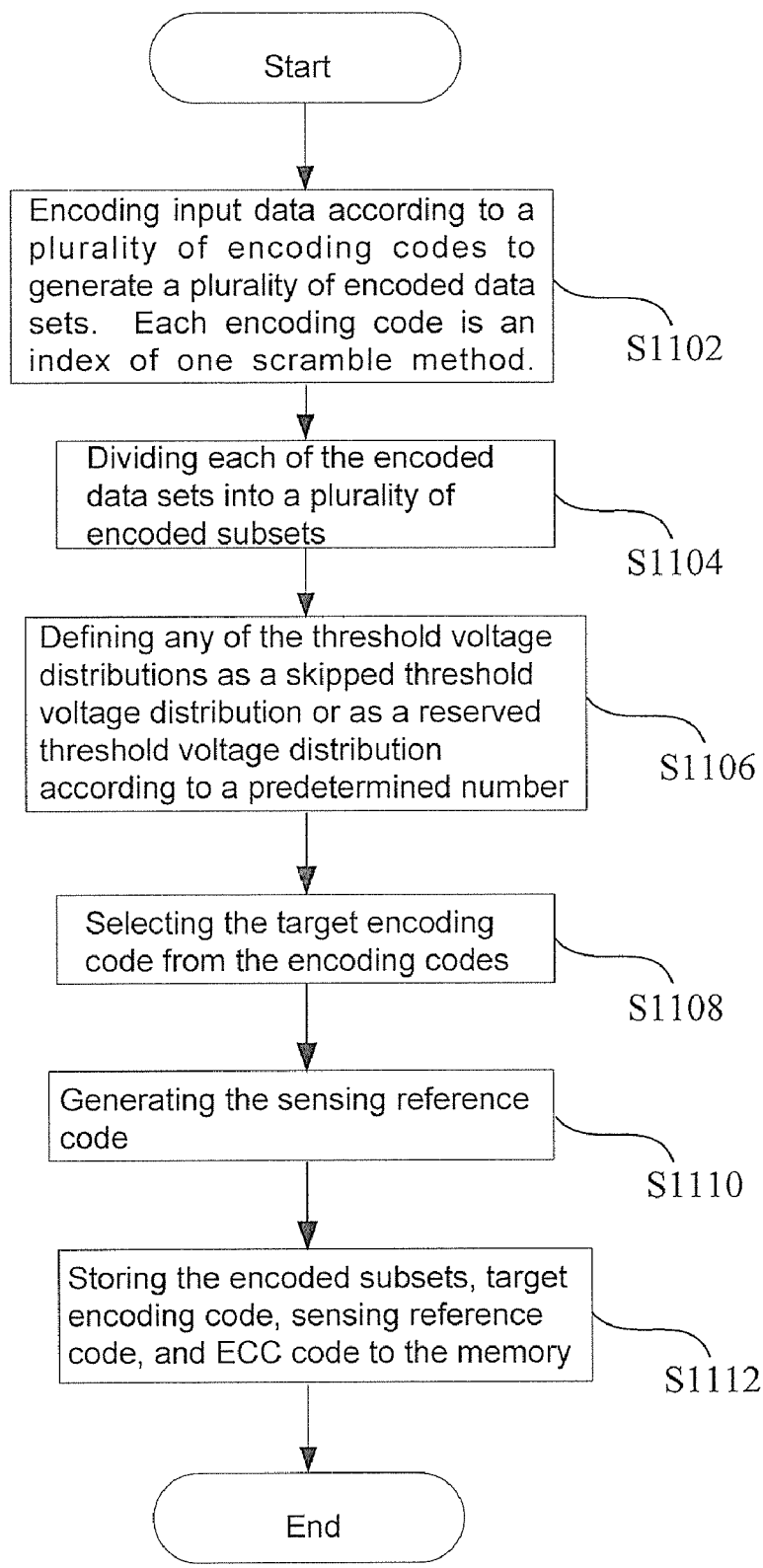
FIG. 11 is a flowchart illustrating a method for operating a memory according to an embodiment of the present invention.

Referring to FIG. 11, FIG. 11 is a flowchart illustrating a method for operating a memory according to an embodiment of the present invention. First, in step S1102, the encoder 130 of the controller 110 encodes the input data $D_A$ according to the plurality of the encoding codes 132 to generate a plurality of the encoded data sets $D_B$. Each of the encoding codes is an index of the scrambling method for changing to number of the instances of the threshold voltage distributions. Moreover, each of the encoded data sets $D_B$ is generated according to a corresponding one of the encoding codes 132. Next, in step S1104, the controller 110 divides each of the encoded data sets $D_B$ into a plurality of encoded subsets 402 (as shown in FIG. 4). Wherein, the encoded subsets 402 are associated with the threshold voltage distributions of the MLC 126. Referring to FIG. 4 and FIG. 7, in an embodiment of the present invention, the encoded subsets 402 of one of the encoded data sets $D_B$ are associated with the threshold voltage distributions B1-B16, and each of the encoded subsets 402 corresponds to one of the instances of the threshold voltage distribution. Next, in step S1106, the controller 110 defines any of the threshold voltage distributions as a skipped threshold voltage distribution or as a reserved threshold voltage distribution according to the predetermined number P1. When the number of the instances of any of the threshold voltage distributions is less than the predetermined number P1, the controller 110 defines such threshold voltage distribution as a skipped threshold voltage distribution. When the number of the instances of any of the threshold voltage distributions is greater than or equal to the predetermined number P1, the controller 110 defines such threshold voltage distribution as a reserved threshold voltage distribution. For example, the threshold voltage distributions B3, B8, B9, B10, B12 and B15 of FIG. 7 are defined as skipped threshold voltage distributions, and the threshold voltage distributions B1, B2, B4-B7, B11, B13, B14 and B16 are defined as the reserved distributions. Moreover, the controller 110 redefines any of the encoded subsets 402 associated with the skipped threshold voltage distribution to be an appointed encoded subset, and redefines any of the encoded subsets associated with the reserved threshold voltage distributions as an original encoded subset. Next, in step S1108, the controller 110 selects the target encoding code 504 from the encoding codes 132. Wherein, the target encoding code 504 corresponds to a maximal number of the skipped threshold voltage distributions as compared with other unselected encoding codes, and the corresponding sensing window thereof is also broadest. In other words, the number of the skipped threshold voltage distributions corresponding to one of the unselected encoding codes is less than the number of the skipped threshold voltage distributions corresponding to the target encoding code 504, and the corresponding sensing windows corresponding to the unselected encoding codes are relatively narrow. Next, in step S1110, the controller 110 generates the sensing reference code 506 according the skipped threshold voltage distributions and the reserved threshold voltage distributions that are corresponded to the target encoding code 504. Next, in step S1112, the controller 110 stores the encoded subsets 502, the target encoding code 504, the sensing reference code 506, and the error correction code 508 to the blocks 121-124 of the memory 120.

In an embodiment of the present invention, before storing the appointed encoded subsets to the memory 120, the controller 110 converts the data values of all appointed encoded subsets, which are associated with the skipped threshold voltage distributions, into one or more of the data values of the reserved threshold voltage distributions. For example, as shown in FIG. 7, the data values of all appointed encoded subsets associated with the skipped threshold voltage distributions B3, B8, B9, B10, B12 and B15 could be converted into the data value "0000" of the reserved threshold voltage distribution B1.

Figure 12:
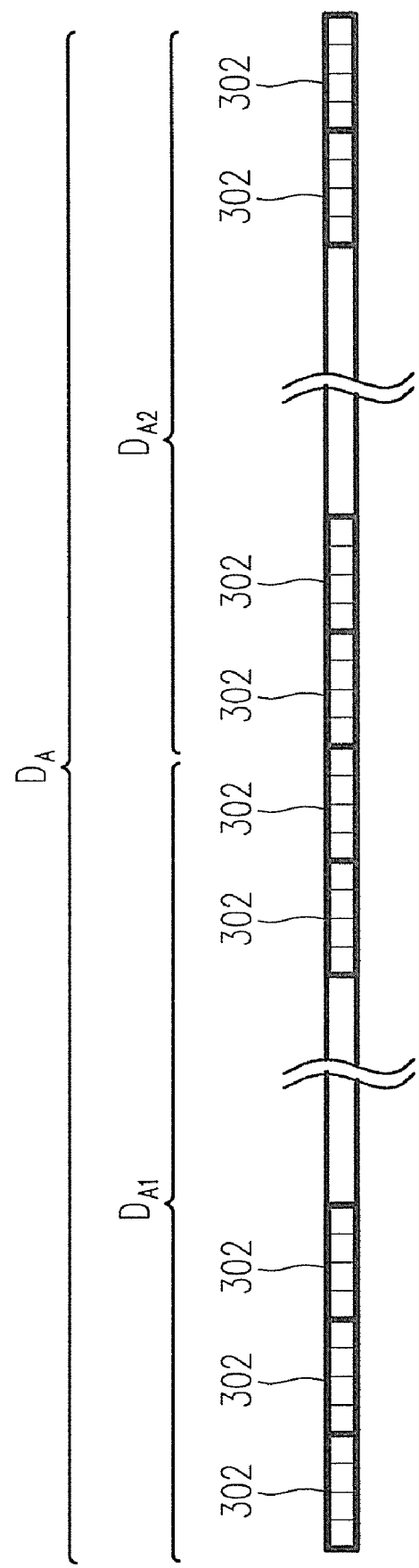
FIG. 12 is a schematic diagram of an input data according to an embodiment of the present invention.

Referring to FIGS. 12 and 13, FIG. 12 is a schematic diagram of the input data $D_A$ according to an embodiment of the present invention, and FIG. 13 is a table explaining a method for the controller 110 selecting the target encoding code 504 according to an embodiment of the present invention. In the present embodiment, the controller 110 first encodes the input data $D_A$ according to the encoding codes 132 to generate the encoded data sets $D_B$, and then selects the target encoding code 504. In the present embodiment, a data length of the input data $D_A$ is 4096 bits, which is divided into 1024 data subsets 302. A data length of each of the data subsets 302 is 4 bits, so that each of the data subsets 302 has 4 bits of data. The controller 110 divides the input data $D_A$ into at least a first section $D_{A1}$ and a second section $D_{A2}$. The first section $D_{A1}$ and the second section $D_{A2}$ respectively have a plurality of the data subsets 302. The first column of FIG. 13 represents various data states. In the present embodiment, since each of the MLCs 126 can store 4 bits of data, there are 16 data states. Moreover, each of the data subsets 302 corresponds to one of the data states. The second column of FIG. 13 represents numbers of the data subsets 302 of the input data $D_A$ in each data state. Taking the data states "0000" and "0001" as an example, the input data $D_A$ has 63 data subsets 302 with the data states of "0000", and has 45 data subsets 302 with the data states of "0001". The third column and the fourth column of FIG. 13 respectively represent numbers of the data subsets 302 of the first section $D_{A1}$ and the second section $D_{A2}$ in each data state. For simplicity's sake, in the present embodiment, only encoding methods corresponding to four encoding codes are taken as an example. The controller 110 can select one of the four encoding codes to serve as the target encoding code 504. However, it should be noticed that the encoding methods and the number of the encoding codes 132 are only used for a demonstration, and the encoding methods and the number of the encoding codes are not limited thereto. In the encoding methods corresponding to the four encoding codes 132, it is set that the data subsets 302 of the first section $D_{A1}$ are not encoded, and only the data subsets 302 of the second section $D_{A2}$ are encoded. In a first encoding method, a first bit and a second bit in each of the data subsets 302 of the second section $D_{A2}$ are inverted to obtain a first encoded section $D_{A2(1)}$. The first encoded section $D_{A2(1)}$ is combined with the first section $D_{A1}$ to form a first encoded data set $D_{B1}$. The first encoded data set $D_{B1}$ also has a plurality of encoded subsets 402 (as shown in FIG. 4), and each of the encoded subsets 402 is obtained by converting a corresponding data subset 302. Wherein, each of the data subsets 302 of the first section $D_{A1}$ directly serves as the encoded subset 402 of the first encoded data set $D_{B1}$ without conversion, and each of the data subsets 302 of the second section $D_{A2}$ is converted into a corresponding encoded subset 402 after the first bit and the second bit thereof are inverted. Referring to FIG. 13, the fifth column and the ninth column of the table respectively represent numbers of the encoded subsets 402 of the first encoded section $D_{A2(1)}$ and the first encoded data set $D_{B1}$ in each data state.

Similarly, in a second encoding method, a third bit and a fourth bit in each of the data subsets 302 of the second section $D_{A2}$ are inverted to obtain a second encoded section $D_{A2(2)}$. In a third encoding method, the first bit and the third bit in each of the data subsets 302 of the second section $D_{A2}$ are inverted to obtain a third encoded section $D_{A2(3)}$. In a fourth encoding method, the second bit and the fourth bit in each of the data subsets 302 of the second section $D_{A2}$ are inverted to obtain a fourth encoded section $D_{A2(4)}$. The second encoded section $D_{A2(2)}$, the third encoded section $D_{A2(3)}$, and the fourth encoded section $D_{A2(4)}$ are respectively combined with the first section $D_{A1}$ to form a second encoded data set $D_{B2}$, a third encoded data set $D_{B3}$, and a fourth encoded data set $D_{B4}$. Referring to FIG. 13, the sixth to the eighth columns of the table respectively represent numbers of the encoded subsets 402 of the second encoded section $D_{A2(2)}$, the third encoded section $D_{A2(3)}$, and the fourth encoded section $D_{A2(4)}$ in each data state, and the tenth to the twelfth columns of the table respectively represent numbers of the encoded subsets 402 of the second encoded data set $D_{B2}$, the third encoded data set $D_{B3}$, and the fourth encoded data set $D_{B4}$ in each data state. In the present embodiment, the aforementioned predetermined number P1 is assumed to be 40. In this case, the first encoded data set $D_{B1}$ corresponds to four skipped threshold voltage distributions, the second encoded data set $D_{B2}$ corresponds to one skipped threshold voltage distribution, the third encoded data set $D_{B3}$ corresponds to five skipped threshold voltage distributions, and the fourth encoded data set $D_{B4}$ corresponds to one skipped threshold voltage distribution. Since the encoding code corresponding to the third encoded data set $D_{B3}$ corresponds to a maximal number of the skipped threshold voltage distributions as compared with other encoding codes, the controller 110 selects the encoding code corresponding to the third encoded data set $D_{B3}$ as the target encoding code 504.

Figure 14:
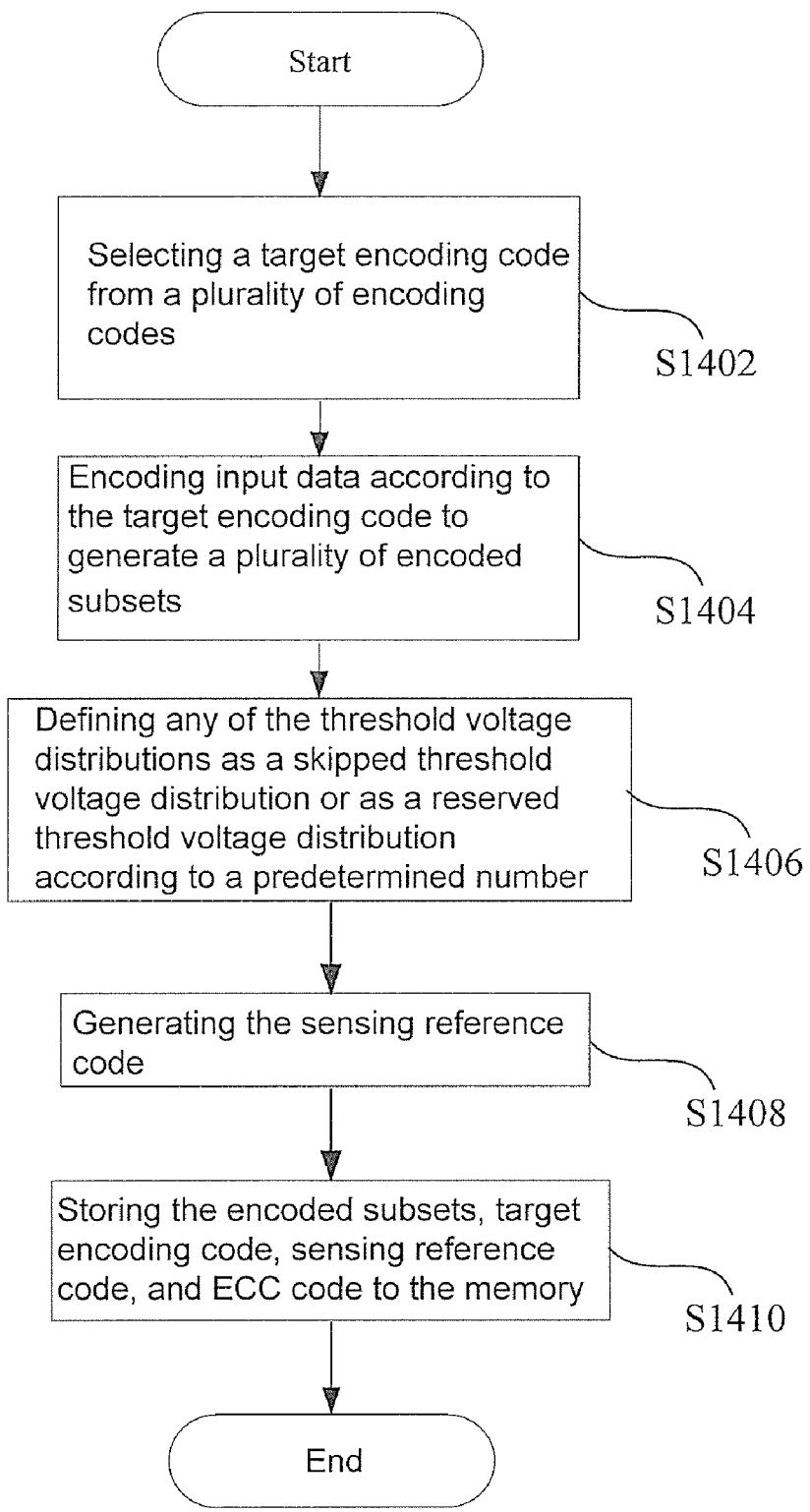
FIG. 14 is a flowchart illustrating a method for operating a memory according to another embodiment of the present invention.

Referring to FIG. 14, FIG. 14 is a flowchart illustrating a method for operating a memory according to another embodiment of the present invention. First, in step S1402, the controller 110 selects one of the encoding codes 132 to serve as the target encoding code 504. Next, in step S1404, the encoder 130 of the controller 110 encodes the input data $D_A$ according to the target encoding code 504 to generate a plurality of the encoded subsets 402. Wherein, the encoded subsets 402 are associated with the threshold voltage distributions of the MLCs 126. Referring to FIG. 4 and FIG. 7, in an embodiment of the present invention, the encoded subsets 402 of one of the encoded data sets $D_B$ are associated with the threshold voltage distributions B1-B16, and each of the encoded subsets 402 corresponds to one of the instances of the threshold voltage distributions B1-B16. Next, in step S1406, the controller 110 defines any of the threshold voltage distributions as a skipped threshold voltage distribution or as a reserved threshold voltage distribution according to the predetermined number P1. When the number of the instances of any of the threshold voltage distributions is less than the predetermined number P1, the controller 110 defines such threshold voltage distribution as a skipped threshold voltage distribution. For example, the threshold voltage distributions B3, B8, B9, B10, B12 and B15 of FIG. 7 are defined as the skipped threshold voltage distributions, and the threshold voltage distributions B1, B2, B4-B7, B11, B13, B14 and B16 are defined as reserved distributions. Moreover, the controller 110 redefines any of the encoded subsets 402 associated with the skipped threshold voltage distribution to be an appointed encoded subset, and redefines any of the encoded subsets associated with the reserved threshold voltage distributions as an original encoded subset. Next, in step S1408, the controller 110 defines the sensing reference code according to the encoding result. Next, in step 1310, the controller 110 stores the encoded subsets 502, the target encoding code 504, the sensing reference code 506, and error correction code 508 to the blocks 121-124 of the memory 120.

In an embodiment of the present invention, before storing the appointed encoded subsets to the memory 120, the controller 110 converts the data values of all appointed encoded subsets, which are associated with the skipped threshold voltage distributions, into one or more of the data values of the reserved threshold voltage distributions. For example, as shown in FIG. 7, the data values of all appointed encoded subsets associated with the skipped threshold voltage distributions B3, B8, B9, B10, B12 and B15 could be converted into the data value "0000" of the reserved threshold voltage distribution B1.

In an embodiment of the present invention, when the step S1402 is executed to select the target encoding code 504 from the encoding codes 132, the controller 110 first analyses the input data $D_A$ to select the most suitable scrambling method and relative encoding code to serve as the target encoding code 504. Referring to FIG. 13, in the present embodiment, the controller 110 first analyses the input data $D_A$ to obtain numbers of the data subsets 302 of the first section $D_{A1}$ and the second section $D_{A2}$ in each data state. Next, the controller 110 determines the numbers of the encoded subsets 402 of the encoded data sets $D_{B1}$-$D_{B4}$ in each data state according to the numbers of the data subsets 302 of the first section $D_{A1}$ and the second section $D_{A2}$ in each data state. In detail, before the encoded sections $D_{A2(1)}$-$D_{A2(4)}$ and the encoded data sets $D_{B1}$-$D_{B4}$ are generated, the controller 110 can determine the numbers of the encoded subsets 402 of the encoded sections $D_{A2(1)}$-$D_{A2(4)}$ in each data state according to the numbers of the data subsets 302 of the second section $D_{A2}$ in each data state. For example, the number of the data subsets 302 having the data state of "0000" in the second section $D_{A2}$ is equal to the number of the encoded subsets 402 having the data state of "1100" in the first encoded section $D_{A2(1)}$, and is equal to the number of the encoded subsets 402 having the data state of "0011" in the second encoded section $D_{A2(2)}$, and is equal to the number of the encoded subsets 402 having the data state of "1010" in the third encoded section $D_{A2(3)}$, and is also equal to the number of the encoded subsets 402 having the data state of "0101" in the fourth encoded section $D_{A2(4)}$. After the controller 110 obtains the numbers of the encoded subsets 402 of each of the encoded sections $D_{A2(1)}$-$D_{A2(4)}$ in each data state, the controller 110 respectively adds the numbers corresponding to each of the encoded sections $D_{A2(1)}$-$D_{A2(4)}$ with the numbers corresponding to the first section $D_{A1}$, so as to determine the number of the encoded subsets 402 of each of the encoded data sets $D_{B1}$-$D_{B4}$ in each data state. By such means, before the encoded sections $D_{A2(1)}$-$D_{A2(4)}$ and the encoded data sets $D_{B1}$-$D_{B4}$ are generated, the encoding method (or the encoding code) corresponding to the maximal number of the skipped threshold voltage distributions can be deduced by the controller 110, so as to select the target encoding code 504. For example, if the predetermined number P1 is also assumed to be 40, before the controller 110 generates the third encoded data set $D_{B3}$, the controller 110 first selects the encoding code corresponding to the third encoded data set $D_{B3}$ to serve as the target encoding code 504. Thereafter, the encoder 130 generates the third encoded data set $D_{B3}$ according to the target encoding code 504 to serve as the encoded data set $D_B$ that is output to the error correction circuit 140.

Figure 15:
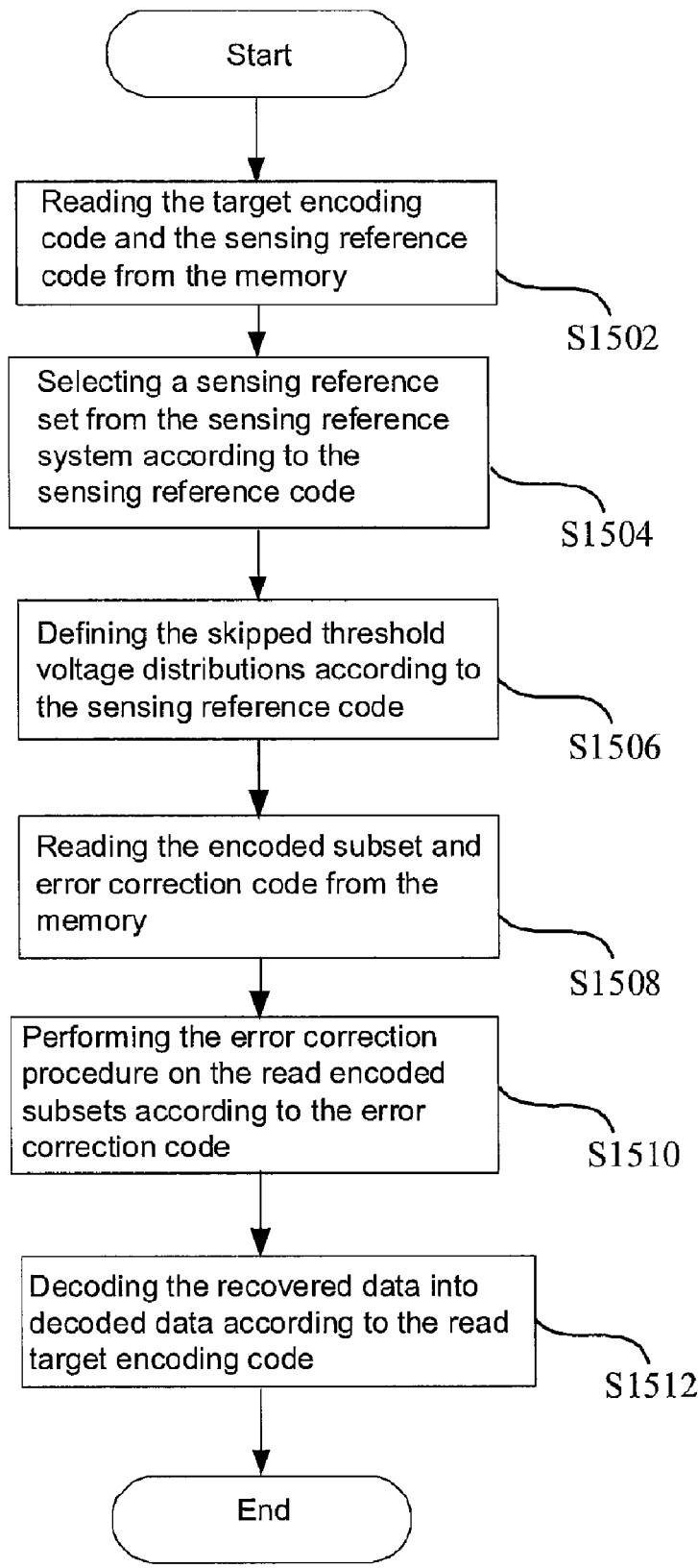
FIG. 15 is a flowchart illustrating a method for reading a memory according to another embodiment of the present invention.

Compared to the write operations of the aforementioned embodiments, the flow chart of the read operations according to an embodiment of the present invention is shown in FIG. 15. Before reading the data stored in the MLCs 126 of the memory 120, the controller 110 first reads the target encoding code 504 and the sensing reference code 506 from the second block 122 and the third block 123. (step S1502). Next, the controller 110 selects a sensing reference set 182 from the sensing reference system 180 according to the sensing reference code 506 (step S1504). Next, the controller 110 defines the skipped threshold voltage distributions according to the sensing reference code (step S1506). Next, the encoded subset 502 and error correction code 508 are read from the first block 121 and the second block 122 (step 1508). Then, the error correction code 508 performs the error correction procedure on the read encoded subsets 502 according to the error correction code 508 to correct and recover the read encoded subsets 502 as recovered data (step S1510). Finally, the decoder 150 decodes the recovered data into decoded data according to the read target encoding code 504 so as to output the original input data $D_A$ (step S1512).

In summary, in the present invention, based on the error correction function, the skipped threshold voltage distributions and the reserved threshold voltage distributions of the MLCs can be defined. The more the skipped threshold voltage distributions are, the broader the corresponding sensing windows are. Therefore, the data values stored in the MLCs can be accurately distinguished, so that an occurrence chance of read operation errors or write operation errors of the data can be reduced. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for operating a memory, the memory comprising a plurality of multi-level cells, the method comprising steps of:
    selecting a target encoding code from a plurality of encoding codes;
    encoding input data according to the target encoding code to generate a plurality of encoded subsets associated with a plurality of threshold voltage distributions of the plurality of multi-level cells;
    defining the plurality of threshold voltage distributions as a plurality of skipped threshold voltage distributions and a plurality of reserved threshold voltage distributions according to a predetermined number, wherein the predetermined number is a number representing a number of instances used to be compared with a number of instances of each of the plurality of threshold voltage distributions;
    generating a sensing reference code according to the plurality of skipped threshold voltage distributions and the plurality of reserved threshold voltage distributions; and
    storing the target encoding code, the sensing reference code, and the plurality of encoded subsets to the memory.

2. The method as claimed in claim 1, further comprising:
    redefining the plurality of encoded subsets associated with the plurality of skipped threshold voltage distributions as a plurality of appointed encoded subsets;
    redefining the plurality of encoded subsets associated with the plurality of reserved threshold voltage distributions as a plurality of original encoded subsets; and
    converting data values of the plurality of appointed encoded subsets into one or more of data values of the plurality of reserved threshold voltage distributions before storing the plurality of appointed encoded subsets to the memory.

3. The method as claimed in claim 1, wherein the target encoding code is selected according to the input data.

4. The method as claimed in claim 1, wherein each of the plurality of encoding codes is an index of one scramble method.

5. The method as claimed in claim 1, further comprising:
    generating an error correction code according to the plurality of encoded subsets; and
    storing the error correction code to the memory.

6. The method as claimed in claim 5, further comprising:
    reading the target encoding code and the sensing reference code from the memory;
    selecting one of a plurality of sensing reference sets from a sensing reference system according to the sensing reference code;
    reading the plurality of encoded subsets and the error correction code from the memory according to reference levels of the selected sensing reference set;
    performing an error correction procedure on the read encoded subsets according to the error correction code to correct and recover the read encoded subsets as recovered data; and
    decoding the recovered data into decoded data according to the read target encoding code.

7. The method as claimed in claim 6, wherein the predetermined number is set according to an upper limit value of the error correction procedure.

8. The method as claimed in claim 1, wherein the memory comprising a first block, a second block, and a third block, the first block has the plurality of multi-level cells for storing all of the plurality of encoded subsets, the target encoding code is stored in the second block, and the sensing reference code is stored in the third block.

9. The method as claimed in claim 1, wherein each of instances of the threshold voltage distribution corresponds to one of the plurality of encoded subsets.

10. A method for operating a memory, the memory comprising a plurality of multi-level cells, the method comprising steps of:
    encoding input data according to a plurality of encoding codes to generate a plurality of encoded data sets, each of which is generated according to a corresponding one of the plurality of encoding codes;
    dividing each of the plurality of encoded data sets into a plurality of encoded subsets associated with a plurality of threshold voltage distributions of the plurality of multi-level cells;
    defining the plurality of threshold voltage distributions as a plurality of skipped threshold voltage distributions and a plurality of reserved threshold voltage distributions according to a predetermined number, wherein the predetermined number is a number representing a number of instances used to be compared with a number of instances of each of the plurality of threshold voltage distributions; selecting a target encoding code from the plurality of encoding codes, wherein the target encoding code corresponds to a maximal number of the plurality of skipped threshold voltage distributions as compared with other unselected encoding codes;
    generating a sensing reference code according to the plurality of skipped threshold voltage distributions and the plurality of reserved threshold voltage distributions that are corresponded to the target encoding code; and storing the target encoding code, the sensing reference code, and the plurality of encoded subsets to the memory.

11. The method as claimed in claim 10, further comprising:
redefining the plurality of encoded subsets associated with the plurality of skipped threshold voltage distributions as a plurality of appointed encoded subsets;
redefining the plurality of encoded subsets associated with the plurality of reserved threshold voltage distributions as a plurality of original encoded subsets; and
converting data values of the plurality of appointed encoded subsets into one or more of data values of the plurality of reserved threshold voltage distributions before storing the plurality of appointed encoded subsets to the memory.

12. The method as claimed in claim 10, wherein each of the plurality of encoding codes is an index of one scramble method.

13. The method as claimed in claim 10, further comprising:
generating an error correction code according to the plurality of encoded subsets; and
storing the error correction code to the memory.

14. The method as claimed in claim 13, further comprising:
reading the target encoding code and the sensing reference code from the memory;
selecting one of a plurality of sensing reference sets from a sensing reference system according to the sensing reference code;
reading the plurality of encoded subsets and the error correction code from the memory according to reference levels of the selected sensing reference set;
performing an error correction procedure on the read encoded subsets according to the error correction code to correct and recover the read encoded subsets as recovered data; and
decoding the recovered data into decoded data according to the read target encoding code.

15. The method as claimed in claim 14, wherein the predetermined number is set according to an upper limit value of the error correction procedure.

16. The method as claimed in claim 10, wherein the memory comprising a first block, a second block, and a third block, the first block has the plurality of multi-level cells for storing all of the plurality of encoded subsets, the target encoding code is stored in the second block, and the sensing reference code is stored in the third block.

17. The method as claimed in claim 10, wherein each of instances of the threshold voltage distribution corresponds to one of the plurality of encoded subsets.

18. A memory apparatus, comprising:
a memory having a plurality of multi-level cells for storing data; and
a controller coupled to the plurality of multi-level cells, the controller comprising an encoder and a calculating circuit;
wherein the controller selects a target encoding code from a plurality of encoding codes, the encoder of the controller encodes input data according to the target encoding code to generate a plurality of encoded subsets associated with a plurality of threshold voltage distributions of the plurality of multi-level cells, the controller defines the plurality of threshold voltage distributions as a plurality of skipped threshold voltage distributions and a plurality of reserved threshold voltage distributions according to a predetermined number, and the predetermined number is a number representing a number of instances used to be compared with a number of instances of each of the plurality of threshold voltage distributions, and
the calculating circuit of the controller generates a sensing reference code according to the plurality of skipped threshold voltage distributions and the plurality of reserved threshold voltage distributions, and the controller stores the target encoding code, the sensing reference code, and the plurality of encoded subsets to the memory.

19. The memory apparatus as claimed in claim 18, wherein the controller redefines the plurality of encoded subsets associated with the plurality of skipped threshold voltage distributions as a plurality of appointed encoded subsets, the controller redefines the plurality of encoded subsets associated with the plurality of reserved threshold voltage distributions as a plurality of original encoded subsets, the controller converts data values of the plurality of appointed encoded subsets into one or more of data values of the plurality of reserved threshold voltage distributions before storing the plurality of appointed encoded subsets to the memory.

20. The memory apparatus as claimed in claim 18, wherein the target encoding code is selected according to the input data.

21. The memory apparatus as claimed in claim 18, wherein each of the plurality of encoding codes is an index of one scramble method.

22. The memory apparatus as claimed in claim 18, wherein the controller generates an error correction code according to the plurality of encoded subsets, and the controller stores the error correction code to the memory.

23. The memory apparatus as claimed in claim 22, further comprising a decoder, a sensing reference system, and an error correction circuit, wherein sensing reference system has a plurality of sensing reference sets, each of the plurality of sensing reference sets has reference levels for distinguishing data read from the memory,
wherein the controller reads the target encoding code and the sensing reference code from the memory and selects one of the plurality of sensing reference sets according to the sensing reference code, the controller reads the plurality of encoded subsets and the error correction code from the memory according to the reference levels of the selected sensing reference set, the correction circuit performs an error correction procedure on the read encoded subsets according to the error correction code to correct and recover the read encoded subsets as recovered data, and the decoder decodes the recovered data into decoded data according to the read target encoding code.

24. The memory apparatus as claimed in claim 23, wherein the predetermined number is set according to an upper limit value of the error correction procedure.

25. The memory apparatus as claimed in claim 18, wherein the memory comprising a first block, a second block, and a third block, the first block has the plurality of multi-level cells for storing all of the plurality of encoded subsets, the target encoding code is stored in the second block, and the sensing reference code is stored in the third block.

26. The memory apparatus as claimed in claim 18, wherein each of instances of the threshold voltage distribution corresponds to one of the plurality of encoded subsets.

27. A memory apparatus, comprising:
a memory having a plurality of multi-level cells for storing data; and a controller coupled to the memory, the controller comprising an encoder and a calculating circuit;

wherein the encoder encodes input data according to a plurality of encoding codes to generate a plurality of encoded data sets, each of which is generated according to a corresponding one of the plurality of encoding codes;

wherein the controller divides each of the plurality of encoded data sets into a plurality of encoded subsets associated with a plurality of threshold voltage distributions of the plurality of multi-level cells, and the controller defines the plurality of threshold voltage distributions as a plurality of skipped threshold voltage distributions and a plurality of reserved threshold voltage distributions according to a predetermined number, and the predetermined number is a number representing a number of instances used to be compared with a number of instances of each of the plurality of threshold voltage distributions, wherein the controller selects a target encoding code from the plurality of encoding codes, the target encoding code corresponds to a maximal number of the plurality of skipped threshold voltage distributions as compared with other unselected encoding codes, the calculating circuit generates a sensing reference code according to the plurality of skipped threshold voltage distributions and the plurality of reserved threshold voltage distributions that are corresponded to the target encoding code, and the controller stores the target encoding code, the sensing reference code, and the plurality of encoded subsets to the memory.

28. The memory apparatus as claimed in claim 27, wherein the controller redefines the plurality of encoded subsets associated with the plurality of skipped threshold voltage distributions as a plurality of appointed encoded subsets, the controller redefines the plurality of encoded subsets associated with the plurality of reserved threshold voltage distributions as a plurality of original encoded subsets, the controller converts data values of the plurality of appointed encoded subsets into one or more of data values of the plurality of reserved threshold voltage distributions before storing the plurality of appointed encoded subsets to the memory.

29. The memory apparatus as claimed in claim 27, wherein each of the plurality of encoding codes is an index of one scramble method.

30. The memory apparatus as claimed in claim 27, wherein the controller generates an error correction code according to the plurality of encoded subsets, and the controller stores the error correction code to the memory.

31. The memory apparatus as claimed in claim 30, further comprising a decoder, a sensing reference system, and an error correction circuit, wherein sensing reference system has a plurality of sensing reference sets, each of the plurality of sensing reference sets has reference levels for distinguishing data read from the memory, wherein the controller reads the target encoding code and the sensing reference code from the memory and selects one of the plurality of sensing reference sets according to the sensing reference code, the controller reads the plurality of encoded subsets and the error correction code from the memory according to the reference levels of the selected sensing reference set, the correction circuit performs an error correction procedure on the read encoded subsets according to the error correction code to correct and recover the read encoded subsets as recovered data, and the decoder decodes the recovered data into decoded data according to the read target encoding code.

32. The memory apparatus as claimed in claim 31, wherein the predetermined number is set according to an upper limit value of the error correction procedure.

33. The memory apparatus as claimed in claim 27, wherein the memory comprising a first block, a second block, and a third block, the first block has the plurality of multi-level cells for storing all of the plurality of encoded subsets, the target encoding code is stored in the second block, and the sensing reference code is stored in the third block.

34. The memory apparatus as claimed in claim 27, wherein each of instances of the threshold voltage distribution corresponds to one of the plurality of encoded subsets.

\* \* \* \* \*